United States Patent [19]
Swiatowiec et al.
[11] 3,917,959
[45] Nov. 4, 1975

[54] HIGH SPEED COUNTER LATCH CIRCUIT

[75] Inventors: Frank J. Swiatowiec, Tempe; Ramachandra A. Rao, Scottsdale, both of Ariz.

[73] Assignee: Motorola, Inc., Chicago, Ill.
[22] Filed: May 2, 1974
[21] Appl. No.: 466,427

[52] U.S. Cl. .......................... 307/223 R; 307/225 R
[51] Int. Cl.$^2$ .......................... H03K 21/00
[58] Field of Search ........ 307/220 R, 223 R, 224 R, 307/225 R; 328/41–43, 48

[56] References Cited
UNITED STATES PATENTS

| | | | |
|---|---|---|---|
| 2,517,986 | 8/1950 | Dickinson | 328/43 X |
| 3,633,114 | 1/1972 | Patel | 328/48 |

*Primary Examiner*—James B. Mullins
*Attorney, Agent, or Firm*—Harry M. Weiss; Kenneth R. Stevens

[57] ABSTRACT

A high speed counter capable of operating in the gigahertz range including a plurality of interconnected latch stages. Information or data is stored in a bipolar directly cross-coupled emitter-coupled cell. Data is selectively written into the cell and transferred between stages by means of a pair of emitter-coupled input or data switching transistors connected to each side of the cell in conjunction with a pair of emitter enable or clock responsive switching transistors selectively controlling current conduction through the cross-coupled cell and the pair of input or data switching transistors. The load circuit for each of the latch stages comprises cascode active circuit means for isolating the feedback lines or internal output nodes associated with the cross-coupled cell and the external data latch output terminals. Predetermined latch stages further include a switchable reset transistor connected to the active cascode load circuit means capable of selectively setting or resetting the counter.

7 Claims, 2 Drawing Figures

HIGH SPEED COUNTER LATCH CIRCUIT

BACKGROUND OF THE INVENTION

1. Field of Invention

This invention relates to a high speed counter circuit.

SUMMARY OF THE INVENTION

Implementation of high speed counters in integrated circuit form having set and reset capability has been limited due to capacitance loading associated with feedback lines, for example, at the internal data nodes of one stage and the data input lines of the input stage.

It is therefore an object of the present invention to provide a high speed counter circuit having set and reset capability and being capable of operating in the gigahertz range.

Another object of the present invention is to provide a high speed counter wherein capacitive loading at internal data output nodes and associated feedback lines are minimized.

Another object of the present invention is to provide a high speed counter circuit which can be readily implemented in integrated circuit form and possessing minimum internal node parasitic capacitance.

In accordance with the aforementioned objects, the present invention provides an emitter-coupled logic latch having active cascode load means for minimizing internal node capacitance and predetermined switchable active cascode load means for selectively setting and resetting latch stages for achieving gigahertz mode operation.

DESCRIPTION OF THE PREFERRED EMBODIMENTS

Figure 1:
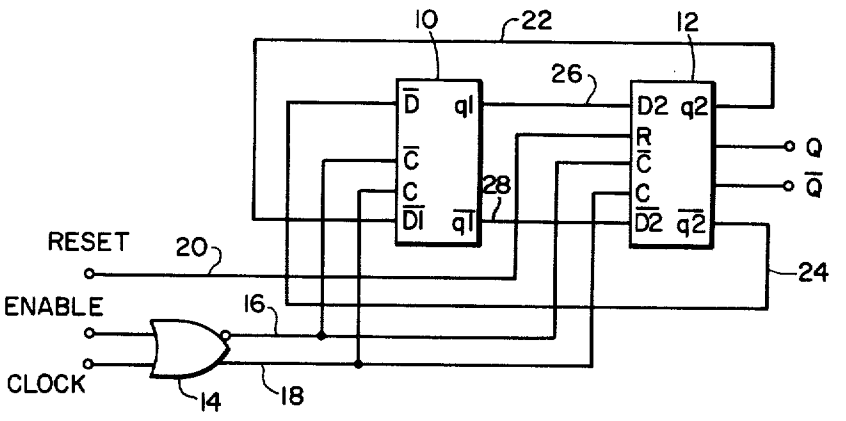
FIG. 1 illustrates an electrical schematic block diagram of the present invention implemented in a two stage counter.

Now referring to FIG. 1, it illustrates the present invention being implemented as a two stage counter. For purposes of simplicity only a two stage counter is illustrated, but it is to be realized that any number of stages may be interconnected in like manner.

The counter comprises a pair of latch circuit stages 10 and 12 connected to a clock circuit 14 for providing enable and clock signals C and C to each of the stages 10 and 12 by means of lines 16 and 18,. Latch stage 12 is adapted to receive a reset signal at input R by means of line 20. Stage 10 receives the enable and clock signals at a pair of terminals designated by the signal representations as $\overline{C}$ and C, respectively. Internal output signals from stage 12, q2 and $\overline{q2}$ are received by input stage 10 by means of feedback lines 22 and 24, respectively, as input stage data signals $\overline{D1}$ and D1. Internal input stage data complementary signals q1 and $\overline{q1}$ are applied to stage 12 by means of lines 26 and 28, and illustrated as data input signals D2 and $\overline{D2}$ for stage 12.

Figure 2:
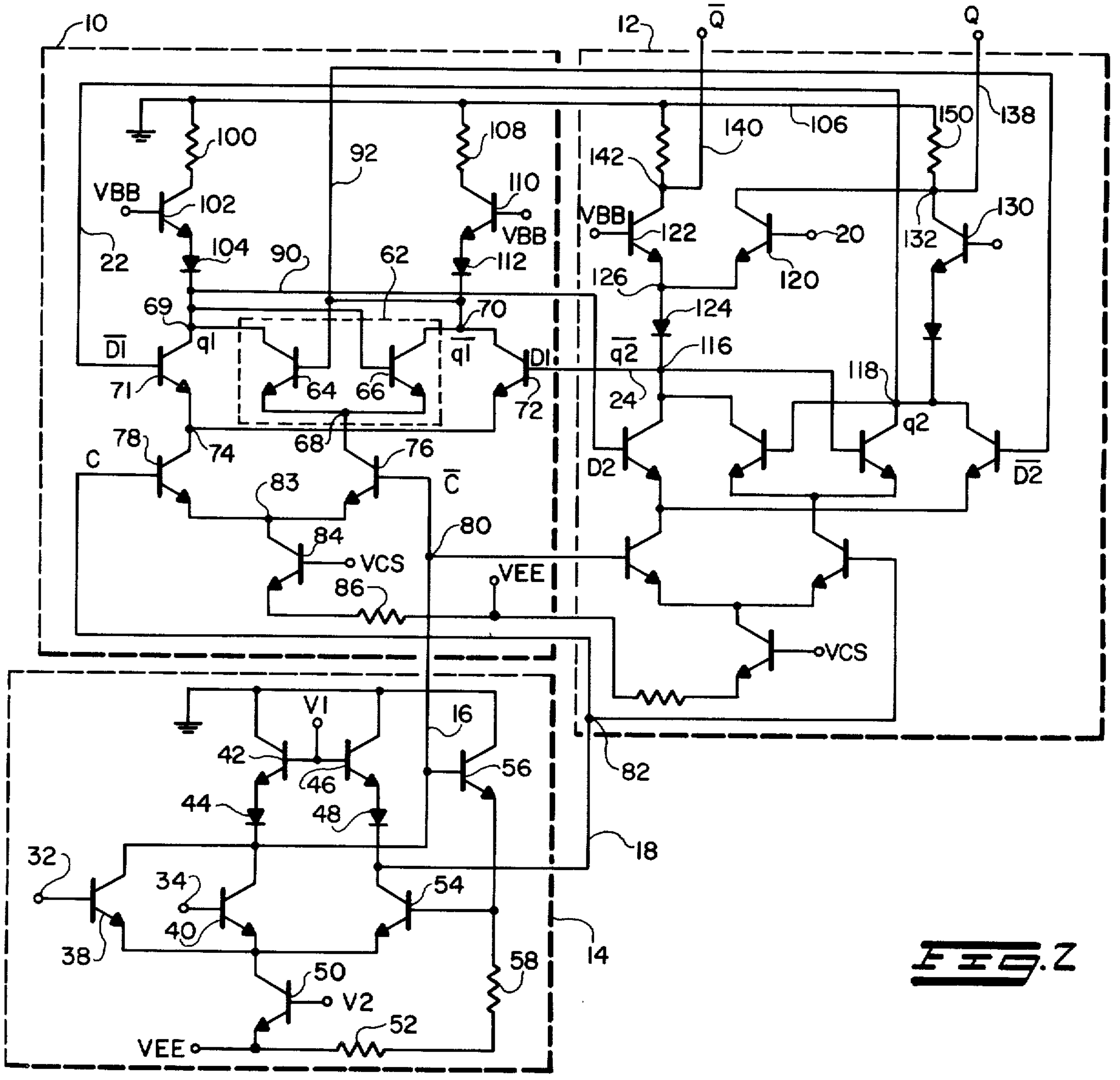
FIG. 2 illustrates a detailed electrical schematic diagram illustrating the implementation of the circuit of FIG. 1.

The specific circuit implementation is shown in FIG. 2 and like reference numerals are employed to designate like elements where possible. The clock circuit means 14 comises a conventional trigger adapted to receive simultaneous enable and clock signals on terminals 32 and 34 in order to generate control signals $\overline{C}$ and C on lines 16 and 18. Circuit 14 includes a pair of input switching transistors 38 and 40 having their respective collector terminals each connected to an active load means constituted by transistor 42, diode 44, transistor 46, and diode 48. The base terminals of transistors 42 and 46 are connected to a reference supply voltage V1. A reference switching transistor 54 is connected between diode 48 and a current source constituting transistor 50, resistor 52, and a voltage supply means constituted by reference voltage source V2 connected to the base of transistor 50 and negative supply voltage VEE connected to resistor 52. Output transistor 56 is connected between biasing resistor 58 and the fixed potentials VEE and ground potential at line 60.

Input stage 10 includes a directly cross-coupled cell 62 constituted by a pair of transistors 64 and 66 having their emitter terminals connected at common node 68 and their collector terminals connected at internal output nodes 69 and 70, for providing internal output signals q1 and $\overline{q1}$. A pair of data input transistors 71 and 72 are connected to each side of the cell and are adapted to receive input signals $\overline{D1}$ and D1, and which in the case of the input stage are constituted by the feedback signals q2 and $\overline{q2}$ applied by means of feedback lines 24 and 22. Transistors 71 and 72 are common emitter connected at node 74, and nodes 68 and 74 are selectively connected to enabling or switching transistors 76 and 78, respectively. The base terminals of transistors 76 and 78 are connected to the clock source 14 signals $\overline{C}$ and C at nodes 80 and 82, respectively. Connected between a node 83 and negative source of potential VEE is a current source means constituted by a constant supply voltage VCS connected to the base of transistor 84 and having its emitter terminal connected to supply voltage VEE by means of resistor 86.

Internal signals q1 and $\overline{q1}$ are connected to stage 12 by means of lines 90 and 92 where the q1 and $\overline{q1}$ signals are received as data input signals to stage 12 and are designated $\overline{D2}$ and D2, respectively.

The load circuits for stage 10 are constituted by the serial connection of resistor 100, transistor 102, and diode 104 connected between ground potential at line 106 and node 69. Similarly, resistor 108, transistor 110, and diode 112 are connected between node 70 and line 106. The bases of both transistors 102 and 110 are connected to constant supply voltage VBB.

The output stage 12 is substantially identical to the input stage 10 except the internal node output signals are generated at nodes 116 and 118 and designated $\overline{q2}$ and q2, respectively. Also, stage or latch circuit 12 includes a switchable reset transistor connected to the active load means and is constituted by transistor 120 having its base terminal connected to reset line 20, its emitter terminal connected between a load transistor 122 and diode 124 at node 126. The collector of transistor 120 is connected to the collector of load transistor 130 at node 132. Finally, the counter output signals designated as Q and $\overline{Q}$ are generated on output lines 138 and 140 connected at node 132 and at a node 142, respectively.

OPERATION OF THE INVENTION

Now referring to FIG. 2 for an operational description of the present invention which employs the use of an emitter-follower and diode to separate the load resistor from the collector circuits of the internal output nodes associated with the cross-coupled cell so as to minimize loading at the feedback point, and which further allows set or reset implementability with a minimum effect on the overall speed of the counter. The counter is capable of responding to signals in the gigahertz range. Input stage 10 accepts data D1 and $\overline{D1}$ by means of feedback lines 24 and 22, respectively, when clock signal C is high and signal $\overline{C}$ is low. In this condition transistor 76 is rendered nonconductive and transistor 78 conductive. During a write mode the input transistors 72 and 74 are selectively rendered conductive or nonconductive in order to selectively set the cross-coupled cell 62 to the appropriate state. When signal $\overline{C}$ goes high and C goes low neither transistors 72 or 74 are capable of conduction and the information read into the cross-coupled cell comprising transistors 64 and 66 stores the information as a current path is now created between either one of the transistors 64 and 66 and the conducting transistor 76.

Now referring to stage 12 which operates in a similar manner but further includes a reset transistor 120 as part of its active cascode load circuit. With a high signal applied to transistor 120 by means of reset line 20 transistor 120 is rendered conductive creating a current path from line 106 through a resistor designated 150 and thus node 132 is driven to a low state and node 116 is pulled higher than node 118 thus forcing the cross-coupled cell to latch into a state corresponding to a reset condition. Although not shown, this type of resetting or setting transistor can be selectively placed between the load transistor emitter terminal and its serial diode in any desired load path in order to selectively change the state of its associated cross-coupled cell. Elements of stage 12, corresponding to like elements specifically described and designated with respect to stage 10, have been shown only schematically for purposes of clarity.

While the invention has been particularly shown and described in reference to the preferred embodiments thereof, it will be understood by those skilled in the art that changes in form and details may be made therein without departing from the spirit and scope of the invention.

What is claimed is:

1. A high speed integrated circuit counter comprising:

a. a plurality of serially interconnected latch circuit stage means having terminal means adapted for connection to a power supply and including a pair of latch output terminals for providing complementary latch output signals;

b. each latch circuit stage means further including input circuit means for receiving complementary data signals at a pair of input terminals and a directly cross-coupled semiconductor cell connected to its said respective input circuit means, each of said cross-coupled cells having a pair of cell output terminals for providing complementary output signals;

c. clock circuit means connected to each of said input circuit means for generating a pair of complementary control signals for setting each of said cross-coupled cells to a predetermined state in conjunction with the applied complementary data signals; and d. each stage including active semiconductor cascode load circuit means coupled between each of said pair of cell output terminals and the terminal means adapted for connection to the power supply for providing isolation at each of said cell output terminals and for supplying load current to a selected side of said cross-coupled cell.

2. A high speed integrated circuit counter as in claim 1 wherein:

a. said active semiconductor cascode load circuit means associated with a predetermined one of said latch circuit stage means further includes active switch circuit means for selectively switching load current to an alternate side of said cross-coupled cell for changing the state of its associated cross-coupled cell.

3. A high speed integrated circuit counter as in claim 2 wherein:

a. each of said active semiconductor cascode load circuit means comprise a pair of current paths coupled between each of said cross-coupled cell output terminal means and said terminal means adapted for connection to the power supply; and b. each path further including a load transistor means having its collector terminal coupled to said terminal means adapted for connection to the power supply, and a diode connected between the emitter terminal of the load transistor means and one of said cell output terminals.

4. A high speed integrated circuit counter as in claim 3 wherein:

a. said active semiconductor cascode load circuit means associated with said predetermined one of said latch circuit stage means further comprises a switching transistor means connected between its said load transistor means and its said diode.

5. A high speed integrated circuit counter as in claim 4 wherein:

a. said plurality of latch circuit stage means are constituted by an input latch circuit stage means and M other latch circuit stage means, where M = 1, 2, 3, 4, . . . ; and b. connection means for connecting said cell output terminals associated with said Mth latch circuit stage means to the said pair of input terminals associated with said input latch circuit stage means.

6. A high speed integrated circuit counter as in claim 5 wherein:

a. each of said cross-coupled cells includes a pair of common emitter directly cross-coupled bipolar transistors; and b. each of said input circuit means comprise a first pair of bipolar transistors having their respective collector terminals connected to respective collector terminals associated with its said common emitter directly cross-coupled bipolar transistors.

7. A high speed integrated circuit counter as in claim 6 wherein each of said latch circuit stage means further includes:

a. enabling circuit means connected to said clock circuit means and comprising a second pair of common emitter bipolar transistors for selectively receiving said complementary control signals at their respective base terminals.

* * * * *